United States Patent [19]

Hirota et al.

[11] Patent Number: 5,406,104
[45] Date of Patent: Apr. 11, 1995

[54] MOSFET CIRCUIT WITH SEPARATE AND COMMON ELECTRODES

[75] Inventors: Masaki Hirota; Teruyoshi Mihara, both of Kanagawa, Japan

[73] Assignee: Nissan Motor Co., Ltd., Yokohama City, Japan

[21] Appl. No.: 181,890

[22] Filed: Jan. 14, 1994

Related U.S. Application Data

[63] Continuation of Ser. No. 793,570, Nov. 18, 1991, abandoned.

[30] Foreign Application Priority Data

Nov. 29, 1990 [JP] Japan .................................. 2-333179

[51] Int. Cl.⁶ ...................... H01L 29/10; H01L 27/01; H01L 27/02; H01L 29/78
[52] U.S. Cl. .................................... 257/351; 257/335; 257/343; 257/350; 257/381; 257/401
[58] Field of Search ................... 357/42; 257/351, 343, 257/335, 350, 381, 401

[56] References Cited

U.S. PATENT DOCUMENTS

| | | | |
|---|---|---|---|
| 4,566,025 | 1/1986 | Jastrzebski et al. | 357/42 |
| 4,803,532 | 2/1989 | Mihara . | |
| 4,949,142 | 8/1990 | Contiero et al. | 257/343 |
| 5,034,797 | 7/1991 | Yamanoka et al. | 357/42 |
| 5,087,954 | 2/1992 | Shirai | 357/41 |
| 5,091,760 | 2/1992 | Maida et al. | 357/23.4 |
| 5,105,252 | 4/1992 | Kim et al. | 357/43 |
| 5,185,535 | 2/1993 | Farb et al. | 257/351 |

FOREIGN PATENT DOCUMENTS 0191370 10/1984 Japan .

OTHER PUBLICATIONS

Seibundoshinkoska, "Denshi Kairo Dai Jiten", chapter 52, p. 407.

Ohmu Sha, Handotai Handbook (2nd edition), vol. 6, chapter 2, p. 413.

Primary Examiner—Sara W. Crane
Assistant Examiner—Valencia Martin Wallace
Attorney, Agent, or Firm—Foley & Lardner

[57] ABSTRACT

A transistor circuit such as an integrated circuit contains at least first and second MOS transistors having drain electrode pair and source electrode pair, one of which is a pair of electrodes connected together and integrated into a common drain or source electrode, and the other of which is a pair of separate electrodes. In a semiconductor substrate, there are formed at least one common region, such as a drain contact region or a source region, connected with the common electrode, and a plurality of first and second individual regions selectively connected with the separate electrodes. Around the common region or each common region, a predetermined number of the individual regions are arranged in such a manner as to improve the thermal balance of the substrate and enable the downsizing of the device.

66 Claims, 11 Drawing Sheets

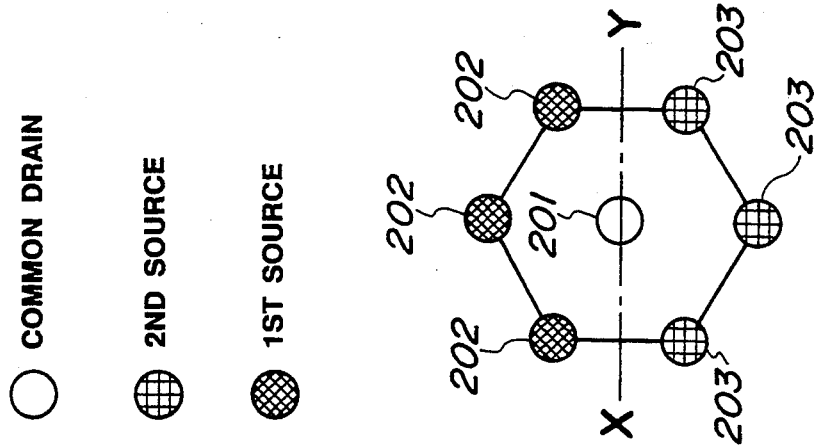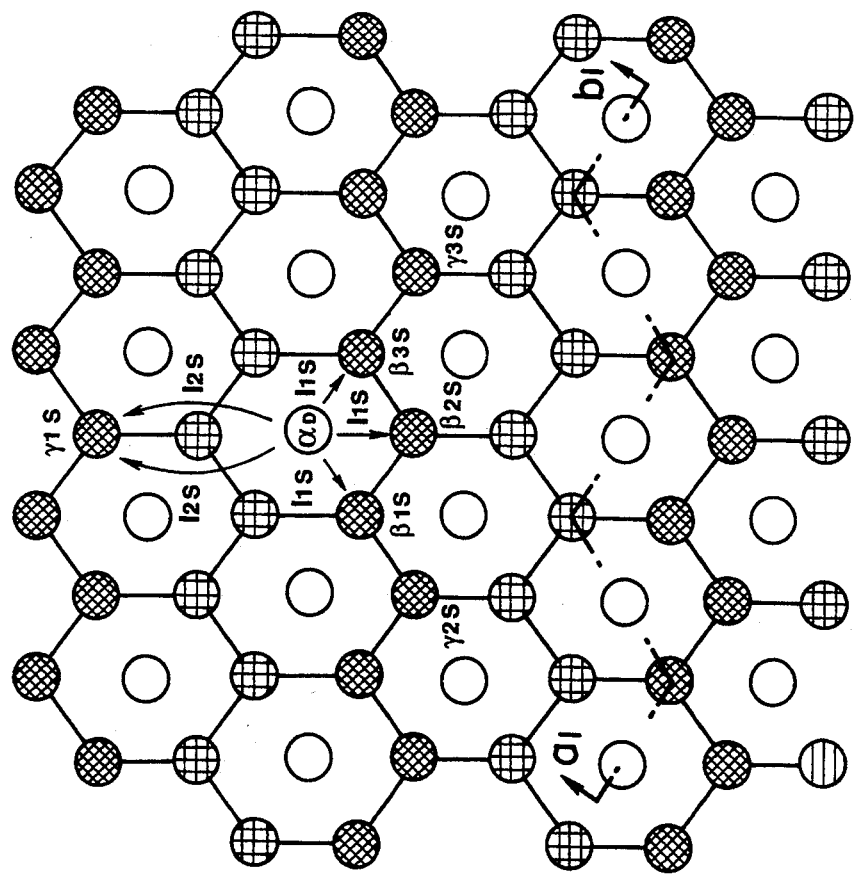

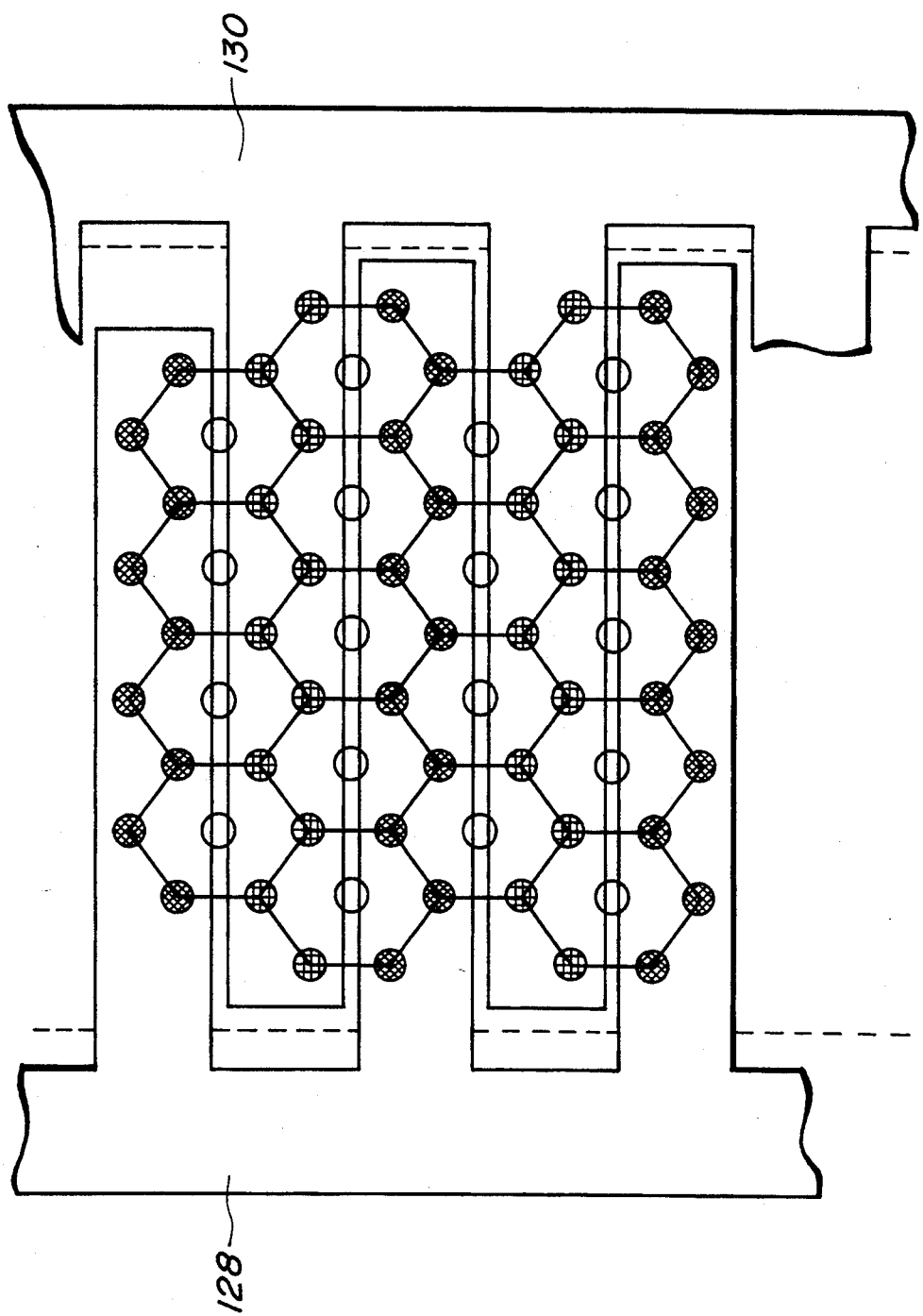

○ COMMON DRAIN
⊕ 2ND SOURCE
▨ 1ST SOURCE

MOSFET CIRCUIT WITH SEPARATE AND COMMON ELECTRODES

This application is a continuation of application Ser. No. 07/793,570, filed Nov. 18, 1991, now abandoned.

BACKGROUND OF THE INVENTION

The present invention relates to transistors and integrated circuits, and more specifically to integrated circuits of double-diffused MOS transistors (DMOS transistors).

An H-bridge driver circuit for driving a DC motor in forward and reverse directions (as disclosed in *Denshi Kairo Dai Jiten*, chapter 52, page 407, published by Seibundoshinkosha) includes four MOS transistors Tr1, Tr2, Tr3 and Tr4. The first and third MOS transistors Tr1 and Tr2 are connected in series between a power supply (VDD) and a ground. The second and fourth MOS transistors Tr2 and Tr4 are also connected in series between the power supply and ground. A load which is a motor M1 is connected between a first branch point between Tr1 and Tr3 and a second branch point between Tr2 and Tr4. In the H-bridge circuit, the drains of Tr1 and Tr2 (which are called high-side switches) are connected together. As to Tr3 and Tr4 (low-side switches), the sources are connected together.

An IC structure of one conventional example contains two DMOS transistors with drains connected together, which can be used as the highside switches Tr1 and Tr2. In this semiconductor device, the first transistor Tr1 consisting of parallel small transistors is formed only in a first half of the chip, and the second transistor Tr2 also consisting of parallel small transistors is formed only in a second half. Therefore, when Tr1 is on, and Tr2 is off, thermal energy is produced only in the first half of the chip by an electric current, and the second half of the chip is not utilized at all.

SUMMARY OF THE INVENTION

It is an object of the present invention to provide an integrated transistor circuit which is advantageous in size reduction, and thermal balance in a semiconductor substrate.

According to the present invention, a transistor circuit, such as an integrated circuit, comprises at least one common region, at least one group of individual regions, at least one common electrode, at least first and second individual electrodes, and at least first and second control electrodes. The first control electrode forms a first transistor such as a MOS transistor with the first individual electrode and the common electrode, and the second control electrode forms a second transistor such as a MOS transistor with the second individual electrode and the common electrode. The common electrode is common to the first and second transistors.

The common region is formed in a semiconductor substrate such as a silicon substrate. The common region may be a common drain contact region (in the case of FIG. 1). Alternatively, the common region may be a common source region (in the case of FIG. 4).

The group of individual regions are also formed in the semiconductor substrate. The individual regions are separated from one another and from the common region in the semiconductor substrate. The individual regions may be source regions when the common region is the common drain region (as shown in FIG. 1). The individual regions may be drain contact regions when the common region is the common source region (as shown in FIG. 4).

The common electrode is connected with the common region. The common electrode may be a common drain electrode when the common region is the drain contact region (as shown in FIG. 1). When the common region is the source region (as shown in FIG. 4), the common electrode is the source electrode common to both transistors.

Each of the first and second individual electrodes is connected with at least one of the individual regions. Each of the individual regions is connected with either of the first and second individual electrodes, and none of the individual regions of the group is connected with both of the first and second individual electrodes. The first and second individual electrodes may be first and second individual source electrodes when the common electrode is the common drain electrode. The first and second individual electrodes may be first and second individual drain electrodes when the common electrode is the common source electrode.

The first control electrode is a first insulated gate electrode which forms the first transistor which is a MOS transistor. The second control electrode is a second insulated gate electrode which forms the second transistor which is also a MOS transistor.

The individual regions are arranged around the common region, and they are equidistant from the common region.

In the semiconductor substrate, there may be further formed first and second separate regions and at least one intervening region. The intervening region is formed between the first and second separate regions, and separates the first and second separate regions from each other. The common region of a first conductivity type is formed in the intervening region, and each of the individual regions of the first conductivity type is formed in either of the first and second separate regions. The intervening region forms a pn junction with each of the first and second separate regions. Therefore, each of the first and second separate regions is opposite in conductivity type to the intervening region. The intervening region may be an n-type drain region (in the case of FIG. 1), or a p-type well region (in the case of FIG. 4). Each of the first and second separate regions may consist of a plurality of well regions (as shown in FIG. 1). Alternatively, the first and second separate regions may be two separate drain regions (as shown by FIG. 5).

According to the present invention, it is possible to form a great number of small first transistors and a great number of second small transistors in a relatively small area of the semiconductor substrate. There are formed a lot of the common regions each of which is surrounded by a predetermined number of the individual regions. The individual regions of the first and second transistors are regularly distributed so as to form a regular periodic network (two-dimensional lattice).

BRIEF DESCRIPTION OF THE DRAWINGS

FIGS. 2A and 2B are schematic views showing a cell arrangement and one unit cell according to the first embodiment.

FIG. 3 is a view showing source electrode patterns of the first embodiment of the invention.

DETAILED DESCRIPTION OF THE INVENTION

FIGS. 1, 2A, 2B and 3 show an integrated transistor circuit according to a first embodiment of the present invention. The transistor circuit according to the first embodiment contains lateral DMOS transistors with drains connected together.

The double-diffused MOS transistors of the first embodiment are advantageous especially when they are used as the high-side switching transistors (Tr1 and Tr2) in the H bridge driver circuit for driving a DC motor in forward and reverse directions. The high-side switching transistors are switching devices connected between a power supply (VDD) and a load such as a motor.

Figure 1:
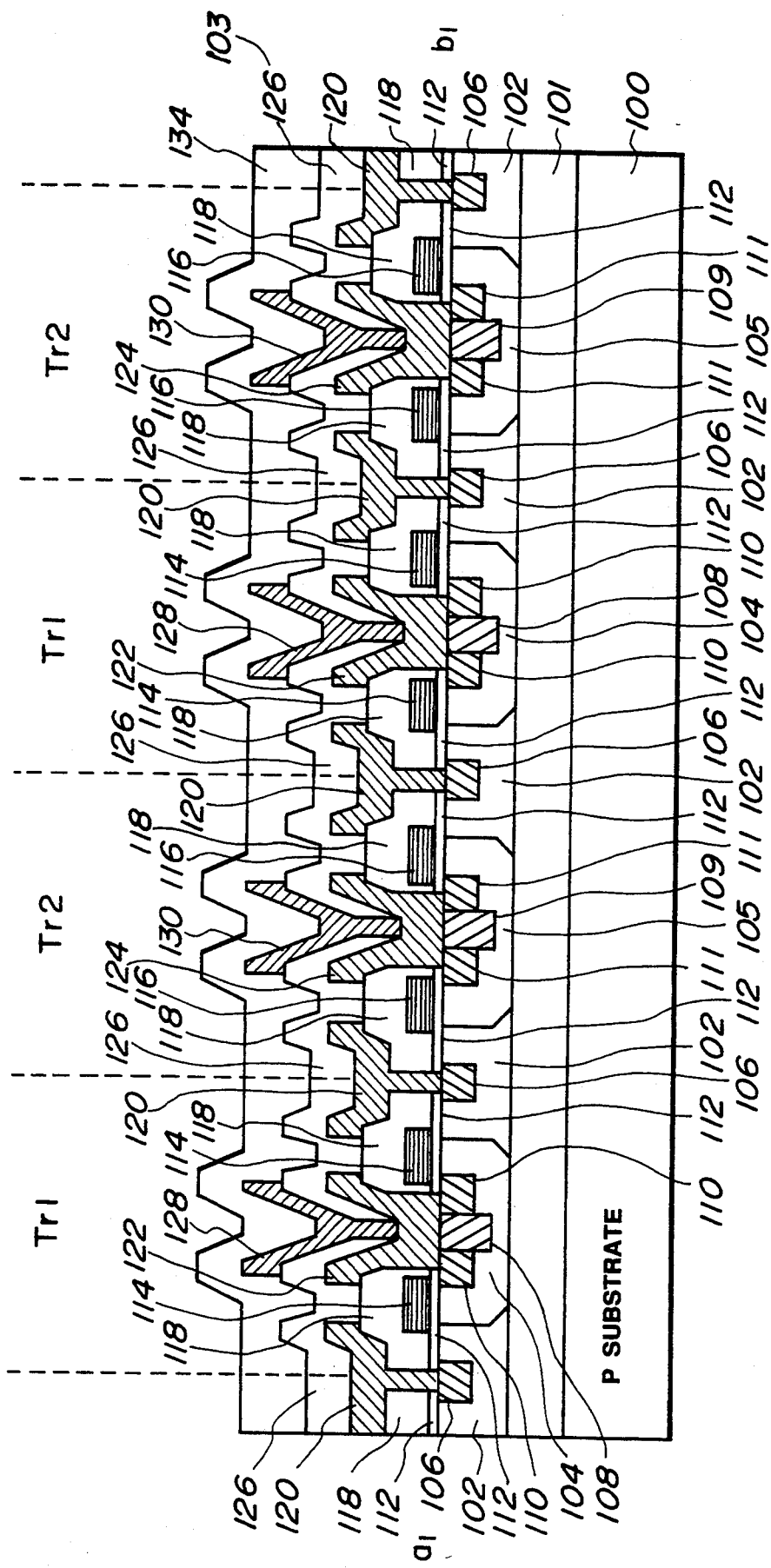
FIG. 1 is a cross sectional view showing a structure of an integrated circuit according to a first embodiment of the present invention.

FIG. 1 shows a cross section of the MOS IC structure employed in the first embodiment. The MOS IC comprises a semiconductor substrate which has a p-type bottom layer 100 (an original substrate), and a top layer (an epitaxial layer) 103 in which various regions are formed. The upper surface of the top layer is a first (top) major surface of the semiconductor substrate. The lower surface of the bottom layer 100 is a second (bottom) major surface of the semiconductor substrate. An n+-type buried layer 101 is formed between the top and bottom layers in the semiconductor substrate. The top layer includes an n-type region 102 which functions as a drain region. The n region 102 extends from the top surface of the semiconductor substrate, to the lower boundary of the top layer. In the first embodiment, the above-mentioned intervening region of the present invention is the n region 102.

The top layer of the semiconductor substrate further includes a plurality of p-type first well regions 104 which are base regions, a plurality of n+-type regions 106 which are drain contact regions, and a plurality of p-type second well regions 105 which are base regions 105. All these regions are formed in the n-type drain region 102, and are separate from one another. Each well region 104 or 105 is surrounded by the n drain region 102 like an island. The side surface of each island is entirely in contact with the n drain region 102. The n drain region 102 has some similarity to an island-studded sea.

In each of the first well regions 104, there are formed a p+-type region 108 (well contact region) for applying a potential to the first well region 104 of the corresponding well region 104, and an n+-type first source region 110. Similarly, a p+-type region 109 and an n+-type second source region 111 are formed in each of the second well regions 105. In each island, the p+ region 108 or 109 is formed at the center of the well region 104 or 105, and surrounded by the source region 110 or 111, which is in turn surrounded by the well region 104 or 105.

The p+ highly doped regions 108 and 109, n+ highly doped source regions 110 and 111 and well regions 104 and 105 all extend vertically into the semiconductor substrate from the top surface (first major surface) of the semiconductor substrate. In the top surface, the p+ region 108 or 109, n+ source region 110 or 111 and p well region 104 or 105 of each island of this embodiment are in the form of concentric circles. In this embodiment, each of these regions is a region of circular diffusion. As shown in FIG. 1, each well region 104 or 105 reaches the n+ buried layer 101. In each island, the p+ central region 108 or 109 is deeper than the annular source region 110 or 111, and the lowest part of the p+ central region 108 or 109 is entirely bounded by the well region 104 or 105.

Each of the n+ highly doped drain contact regions 106 also extends vertically into the semiconductor substrate from the top surface. In this embodiment, each drain contact region 106 is a region of circular diffusion. Each drain contact region 106 of this embodiment is circular in the top surface of the semiconductor substrate.

First and second gate electrodes 114 and 116 are formed on a gate insulating film layer 112 which is formed on the top surface of the semiconductor substrate. The first gate electrode 114 has active portions each of which is assigned to a unique one of the first well regions 104, and each of which is located just above the top surface of the corresponding first p well region 104 between the n drain region 102 and the n+ source region 110. Similarly, the second gate electrode 116 has active portions each of which is located right above the second p well region 105 of the corresponding island. A polysilicon layer can be used to form the first and second gate electrodes 114 and 116.

A multilevel metallization (or multilayer interconnection) structure is formed on the top side of the semiconductor substrate. A first insulating film layer 118 of the multilevel structure is formed on the gate insulating layer 112 and the first and second gate electrodes 114 and 116. A first conducting film layer is formed on the first insulating layer 118.

A common drain electrode 120 is formed from the first conducting layer. The first conducting film layer is divided into three separate divisions 120, 122 and 124. The first division 120 is used as the common drain electrode. The drain electrode 120 is electrically connected with each of the n+ drain contact regions 106 through a circular contact hole formed in the first insulating layer 118 and the gate insulating layer 112. The second division 122 of the first conducting layer has a group of small portions each of which is electrically connected with the p+ highly doped central region 108 and the n+ first source region 110 in a unique one of the first well regions 104 through a circular contact hole formed in the first insulating layer 118 and the gate insulating layer 112. The third division 124 of the first conducting layer also has a group of small portions each of which is electrically connected with the p+ central region 109 and the n+ second source region 111 in a unique one of the second well regions 105 through a circular contact hole formed in the first insulating layer 118 and the gate insulating layer 112.

First and second individual source electrodes 128 and 130 are formed from a second conducting film layer. The second conducting layer is formed on a second insulating layer 126 which is formed on the first conducting layer remaining as the drain electrode pattern 120 and the second and third patterns 122 and 124. The second conducting film layer is divided into two separate patterns which are used, respectively, as the first source electrode 128 and the second source electrode 130. The first source electrode 128 is electrically connected with the first source regions 110 through the second division 122 of the first conducting layer. The second source electrode 130 is electrically connected with the second source regions 111 through the third division 124 of the first conducting layer. A plurality of contact holes are formed in the second insulating layer 126 for interconnections between the first source electrode 128 and the division 122 of the first conducting layer, and between the second source electrode 130 and the division 124 of the first conducting layer. The source electrodes 128 and 130 are covered by a protective film layer 134 for protecting various devices formed on the semiconductor substrate.

In this way, there are formed a plurality of small first and second MOS transistors. Each of the first small transistors is formed by the drain region 102, one of the n+ first source regions 110, one of the first p well regions 104 and the first gate electrode 114. Each of the second small transistor is formed by the n drain region 102, one of the second n+ source region 111, one of the second p well region 105 and the second gate electrode 116. The first small MOS transistors are connected in parallel with one another to form a large first MOS transistor Tr1. The second small MOS transistors are also connected in parallel to form a large second MOS transistor Tr2. The drain electrodes of the first and second small transistors are all connected together and integrated into the common drain electrode 120. The source electrodes of the first small transistors are connected together and integrated into the first source electrode 128. The source electrodes of the second small transistors are connected together and integrated into the second source electrode 130. The three main electrodes of the first large MOS transistor Tr1 are the first source electrode 128, the common drain electrode 120 and the first gate electrode 114. The second source electrode 130, the common drain electrode 120 and the second gate electrode 116 are used for the second large MOS transistor Tr2. In the first embodiment, the drain electrode 120, the drain region 102 and the drain contact regions 106 are common to the first and second large MOS transistors Tr1 and Tr2.

The function of the n+ buried layer 101 is to electrically separate the p well regions 104 and 105 from the p bottom layer 100. Furthermore, between the n+ buried layer 101 and the p well regions 104 and 105, there are formed diodes which act to protect the MOS transistors Tr1 and Tr2. It is possible to omit the n+ buried layer 101 when the n region 102 is thick enough to separate the well regions 104 and 105 sufficiently from the p bottom layer 100, and there is no need for protecting Tr1 and Tr2.

As schematically shown in FIG. 2A, the source regions 110 and 111 are orderly arranged so as to form a regular periodic two-dimensional lattice (or network) made by repetition of a unit cell. In this embodiment, the unit cell has the shape of a regular hexagon, as shown in FIG. 2B. In the hexagon of each cell, a common drain 201 (the drain contact region 106) is formed in the center. Three first sources 202 (the first source regions) and three second sources 203 (the second source regions) are formed, respectively, at the six vertexes (lattice points) of the hexagon. As shown in FIG. 2B, the three first sources 202 are all located on an upper side of a one dot chain line X-Y (bisecting line) which passes through the center of the polygon, and the three second sources 203 are all located on a lower side of the line X-Y. Each cell of the first embodiment can be divided by a median plane (or the bisecting line X-Y) into two equivalent halves one of which includes only the first sources 202, and the other of which includes only the second sources 203. The three second sources 203 of each hexagon are arranged like a mirror image of the three first sources 202 with respect to the line X-Y. As shown in FIG. 2A, each source 202 or 203 is surrounded and shared by the three nearest common drains 202. Therefore, two of the sources 202, 203 can be allotted to each drain 201 (since there are six of the vertexes, and $6 \times \frac{1}{3} = 2$). In FIGS. 2A and 2B, straight line segments connecting the first and second sources 202 and 203 are merely imaginary lines for showing the shape of the unit cells. The first and second sources 202 and 203 are not electrically connected. The cross section of FIG. 1 is taken along a line a1-b1 shown in FIG. 2A.

As shown in FIG. 2A, each common drain 201 is surrounded by a predetermined number (six in this embodiment) of the sources 202 and 203 which are the nearest neighbors and which are arranged in a circle at regular intervals. On the other hand, each source 202 or 203 is surrounded by the nearest common drains 201 which are three in number in this embodiment, and which are arranged in a circle at regular intervals. In the network, there are many sets each of which consists of a neighboring pair of the sources 202 and/or 203 each of which is one of the nearest neighbor of the other, and a neighboring pair of the drains 201 each of which is one of the nearest neighbor of the other. In each of these sets, the centers of the two neighboring sources and the two neighboring drains form a quadrangle having four equal sides (a rhombus). That is, in each set, the two drains are equidistant from each of the two sources.

FIG. 3 shows the first and second source electrode patterns 128 and 130 according to the first embodiment. Each pattern 128 or 130 formed by the second conducting layer is shaped like a comb, and has a plurality of fingers (or teeth) each of which is in the form of a stripe, as shown in FIG. 3. The stripes of the first and second source electrode patterns 128 and 130 are parallel to one another, and arranged alternately like the interdigitating fingers of both hands.

Figure 4:
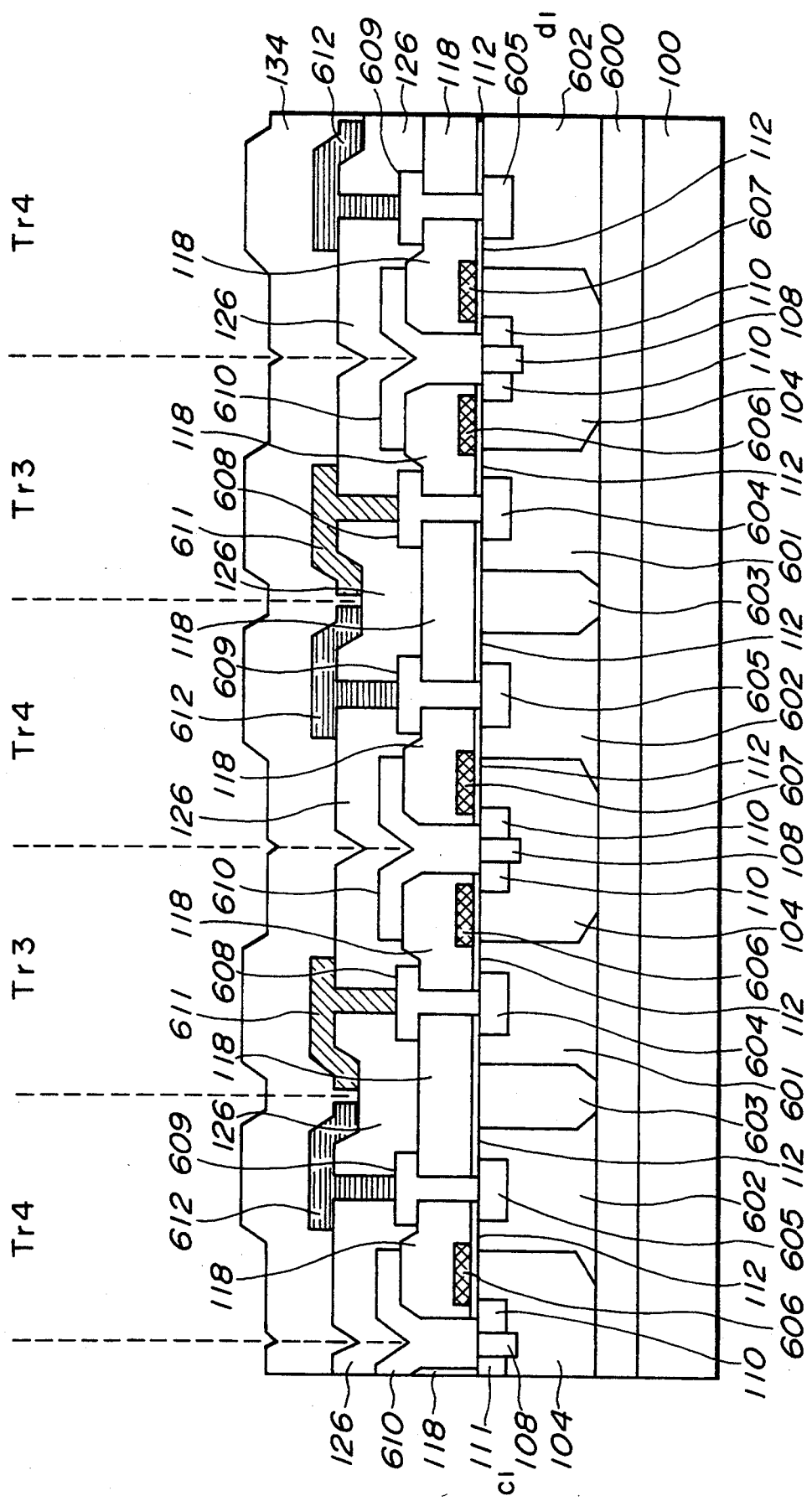
FIG. 4 is a cross sectional view showing a structure of an integrated circuit according to a second embodiment of the present invention.

A second embodiment of the present invention is shown in FIG. 4. An integrated circuit according to the second embodiment contains lateral DMOS transistors with sources connected together. The MOS transistors of the second embodiment can be used, in the H bridge driver, as the low side switching transistors (Tr3 and Tr4) connected between the load and ground.

A semiconductor substrate shown in FIG. 4 has a top layer in which various regions are formed, a p-type bottom layer 100 (which is an original substrate), and a p+-type buried layer 600 which is buried between the top and bottom layers.

At least one first n-type drain region 601 and at least one second n-type drain region 602 are formed in the top layer of the substrate. Each of the n-type drain regions 601 and 602 is electrically separated from the other by p-type well regions 104 and p-type isolation wells (walls) 603. Each well region 104 serves as a base region. A plurality of highly doped n+-type first drain contact regions 604 are formed in the first n drain region 601. A plurality of highly doped n+-type second drain contact regions 605 are formed in the second n drain region 602.

A p+-type well contact region 108 and an n+-type common source region 110 are formed in each of the p well regions 104. The p+ well contact region 108 is formed at the center of each well region 104, and surrounded by the n+ source region 110.

A first gate electrode 606 is formed, with the interposition of a gate insulating layer 112, on the top surface of a predetermined portion of each p well region 104 between the first n drain region 601 and the n+ source region 110. A second gate electrode 607 is formed, with the interposition of the gate insulating layer 112, on the top surface of a predetermined portion of each p well region 104 between the second n drain region 602 and the n+ source region 110.

A first insulating layer 118 is formed on the gate insulating layer 112 and the first and second gate electrodes 606 ad 607. A first conducting electrode layer is formed on the first insulating layer 118. The first conducting electrode layer is divided into three separate portions 608, 609 and 610. The third portion 610 of the first conducting electrode layer is used as a common source electrode 610. The first portion 608 is connected with each of the n+ first drain contact regions 604 through a contact hole formed in the first insulating layer 118 and the gate insulating layer 112. The second portion 609 is connected with each of the n+ second drain contact regions 605 through a contact hole formed in the first insulating layer 118 and the gate insulating layer 112. The source electrode 610 is connected with the p+ well contact region 108 and the n+ source region 110 of each well through a contact hole formed in the first insulating layer 118 and the gate insulating layer 112.

A second insulating layer 126 is formed on the entirety of the surfaces of the divisions 608, 609 and 610 of the first conducting layer. A second conducting electrode layer is formed on the second insulating layer 126. The second conducting electrode layer is divided into two separate divisions one of which is connected with the division 608 of the first conducting layer through contact holes, and used as a first drain electrode 611, and the other of which is connected with the division 609 of the first conducting layer through contact holes, and used as a second drain electrode 612. A protective film layer 134 is formed on the drain electrodes 611 and 612.

The thus-constructed semiconductor structure includes a plurality of small third and fourth MOS transistors. Each of the third small MOS transistor is formed by the first n drain region 601, one of the first n+ source regions 110 and the first gate electrode 606. Each of the fourth small MOS transistor is formed by the second n drain region 602, one of the n+ source regions 110, and the second gate electrode 607. The third small MOS transistors are connected in parallel, and form a large third transistor Tr3. The fourth small MOS transistors are connected in parallel, and form a fourth large transistor Tr4.

Figure 5B:
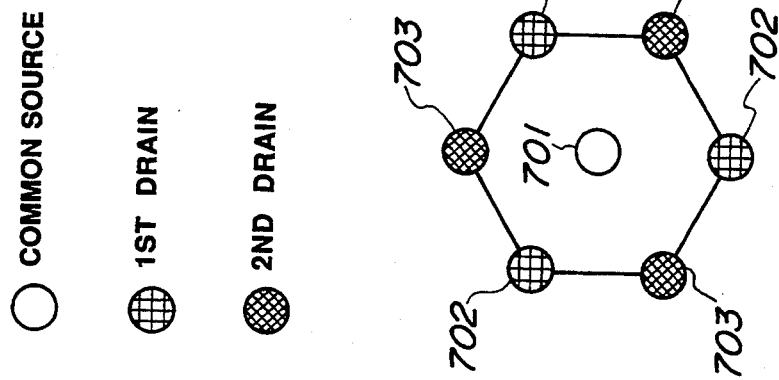
FIGS. 5A and 5B are schematic views showing a cell arrangement and one unit cell of the second embodiment.
Figure 5A:
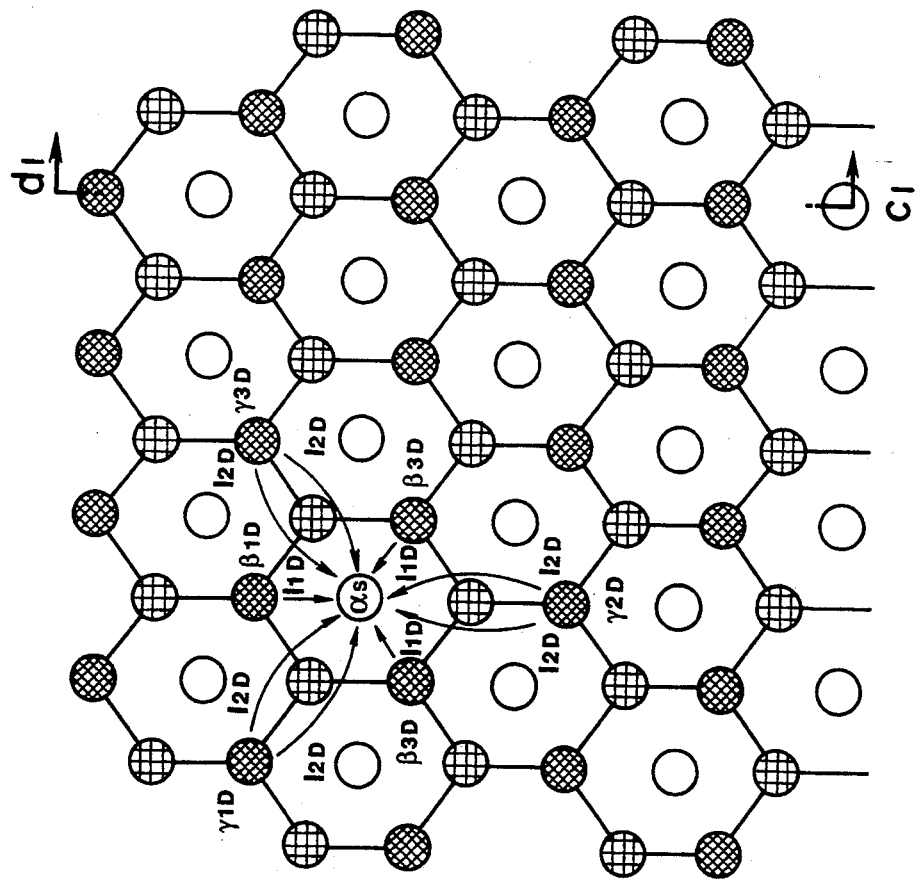

FIGS. 5A and 5B show the cell arrangement and unit cell according to the second embodiment of the invention. The unit cell of the second embodiment is also in the form of a equilateral six-sided polygon.

In each hexagonal cell, a common source 701 of the third and fourth transistors Tr3 and Tr4 are formed in the center. Three first drains 702 (drain contact regions) of the MOS transistor Tr3 and three second drains 704 (drain contact regions) of the MOS transistor Tr4 are alternately arranged at the six vertexes of the hexagon around the common source 701. As shown in FIG. 5B, each drain 702 or 703 connected to one drain electrode has the two nearest neighboring drains 703 or 702 which are both connected to the other drain electrode. The cross section of FIG. 4 is taken along a line c1-d1 of FIG. 5A.

Figure 6:
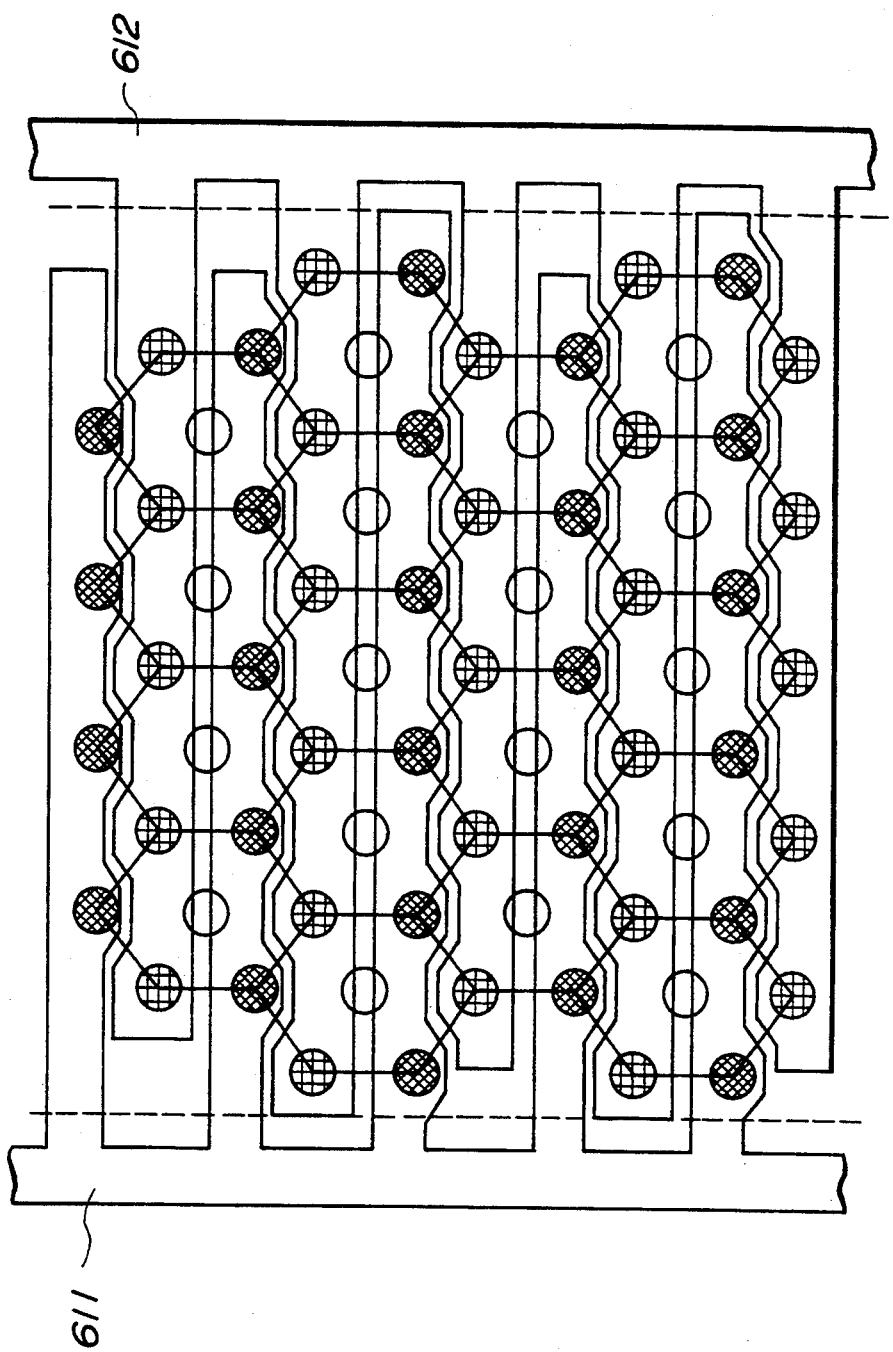
FIG. 6 is a view showing drain electrode patterns according to the second embodiment.

FIG. 6 shows the patterns of the first and second drain electrodes 611 and 612 formed from the second conducting electrode layer. Each pattern has a plurality of fingers in the form of stripes, and the stripes of the first and second drain electrodes 611 and 612 are alternately arranged.

In the second embodiment, the first and second individual drains 702 and 703 are alternately arranged around each common source 701, as shown in FIGS. 5A and 5B. However, it is possible to arrange the first and second drains 702 and 703 in a manner similar to the arrangement of the first and second individual regions 202 and 203 shown in FIG. 2B. In this case, the three first drains 702 are arranged consecutively in one half of a circle around the common source 701 of each cell, and the three second drains 703 are arranged consecutively in the other half of the circle. In this variation of the second embodiment, the number of the stripe-shaped fingers of each of the first and second drain electrode patterns 611 and 612 is reduced by half, as compared with the patterns shown in FIG. 6. Therefore, it is possible to achieve low resistance interconnection patterns by increasing the width of the stripe fingers.

The MOS transistors according to the first and second embodiments are advantageous especially when they are used in the H bridge circuit for driving a motor in forward and reverse directions.

In the H bridge driver, the drain electrodes of high side MOS transistors Tr1 and Tr2 are connected together and connected to a supply terminal connected with a power supply, and the source electrodes of low side MOS transistors Tr3 and Tr4 are connected together and connected with a ground terminal. The source electrode of the first transistor Tr1 and the drain electrode of the third transistor Tr3 are connected together at a first branch point. Similarly, the drain and source electrodes of the second and fourth transistors Tr2 and Tr4 are connected together at a second branch point. The motor is connected between the first and second branch points. In this way, the transistors Tr1 and Tr3 are connected in series between the supply and ground terminals. The second and fourth transistors Tr2 and Tr4 are also connected in series between the supply and ground terminals. The motor is between the first branch point between Tr1 and Tr3, and the second branch point between Tr2 and Tr4. The motor is driven in the forward direction when the two MOS transistors Tr1 and Tr4 are turned on, and the other transistors Tr2 and Tr3 are held off. In this case, a current flows from the supply terminal to the ground terminal through the first transistor Tr1, the motor and the fourth transistor Tr4. When, on the other hand, Tr1 and Tr4 are off, and Tr2 and Tr3 are on, then a current drives the motor in the reverse direction by flowing through the second transistor Tr2, the motor and the third transistor Tr3. The four MOS transistors Tr1, Tr2, Tr3 and Tr4 are never put in the conducting state all together. When, for example, the first and fourth MOS transistors Tr1 and Tr4 are in the conducting state, the other two transistors Tr2 and Tr3 are always in the non-conducting state.

When a gate voltage equal to or higher than a threshold value is applied to the first gate electrode 114 of the first MOS transistor Tr1 of the first embodiment shown in FIG. 1, then an inversion layer is formed in each p well region 104 directly below the first gate electrode 114. This inversion layer serves as a conducting channel between the n drain region 102 and the n+ source region 110. Therefore, the current flows in the MOS transistor Tr1 as shown by arrows I1s and I2s.

From one of the common drains 201 denoted by $\alpha D$ in FIG. 2A, currents I1s flow to the three first nearest sources 202 denoted by $\beta 1s$, $\beta 2s$ and $\beta 3s$ in the same cell. Furthermore, a current I2s flows from the common drain $\alpha D$ to the second nearest source 202 denoted by $\delta 1s$ in the adjacent cell. The other second nearest sources 202 denoted by $\delta 2s$ and $\delta 3s$ receive no current from the common drain $\alpha D$ because the first nearest sources $\beta 2s$ and $\beta 3s$ lie in the middles of the straight line segments radiating from the common drain $\alpha D$ to these second nearest sources $\delta 2s$ and $\delta 3s$.

It must be noted that the first and second MOS transistors Tr1 and Tr2 are both formed in each single unit cell. Therefore, as compared with the conventional arrangement in which the first and second transistors Tr1 and Tr2 are formed separately, the area of the source region per unit area is reduced by half while the area of the drain region per unit area remains unchanged. Therefore, the drain contact resistance can be reduced by half when the first and second transistors Tr1 and Tr2 are formed in the same area as the conventional device. The current I2s flows to the second nearest source in addition to the current to the first nearest sources. Therefore, the current capacity per unit area is not reduced to a half value. The structure of the first embodiment can reduce the drain contact resistance by half, and increase the current carrying capacity. Furthermore, it is possible to reduce the Joule heat per unit area by half. The evolution of thermal energy produced by current is distributed uniformly over a wide area of the semiconductor substrate. Therefore, the thermal balance is improved in the semiconductor substrate. Moreover, it is possible to reduce the bulk resistance, as compared with the conventional transistor structure.

When a gate voltage equal to or higher than a threshold value is applied to the second gate electrode 607 of the fourth MOS transistor Tr4 of the second embodiment, then an inversion layer (channel) is formed in the p well region 104 directly below the gate electrode 607. Therefore, the current flows in the fourth MOS transistor Tr4 through this conducting channel between the n drain region 602 and the n+ source region 110, as shown by I1D and I2D in FIG. 5A. The current I1D flows to the common source 701 denoted by $\alpha s$ in FIG. 5A from the three first nearest drains $\gamma 1D$, $\gamma 2D$ and $\gamma 3D$ in the same cell. The current I2D flows from the three second nearest drains $\delta 1D$, $\delta 2D$ and $\delta 3D$ as shown in FIG. 5A. In this way, the structure of the second embodiment can offer advantages similar to those of the first embodiment.

Figure 7A:
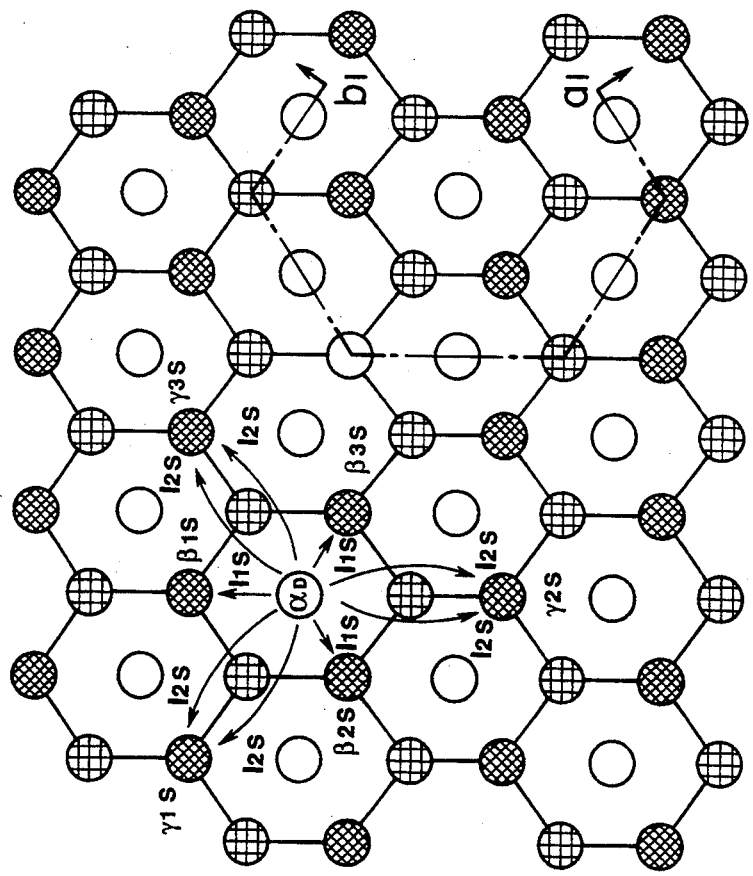
FIG. 7A and 7B are schematic views showing a cell arrangement and one unit cell according to a variation of the first embodiment.
Figure 7B:
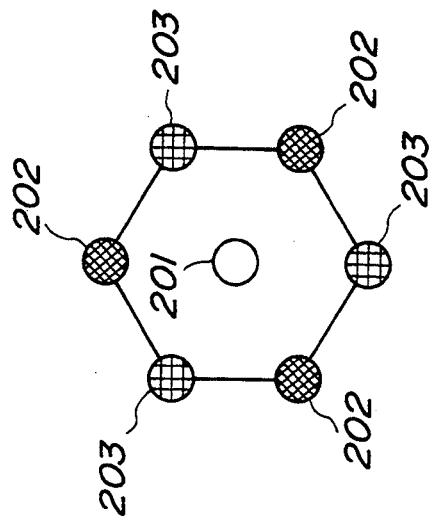

FIGS. 7A and 7B show a variation of the first embodiment. In this variation, there are formed the first and second lateral type DMOS transistors with a common drain. The cross sectional structure of this variation is substantially the same as the structure shown in FIG. 1. However, the first and second individual sources 202 and 203 are arranged alternately as shown in FIG. 7B. The first and second source electrodes 128 and 130 are patterned in the same manner as shown in FIG. 6. The first source electrode 128 of this variation is shaped like the first drain electrode 611 shown in FIG. 6, and the second source electrode 130 is shaped like the second drain electrode 612 of FIG. 6.

As shown in FIG. 7A, the currents I1s and I2s flow when the gate voltage equal to or higher than the threshold value is applied to the gate electrode 114 of the first transistor Tr1. The first current I1s flows from each central common drain $\alpha D$ to the three first nearest sources $\beta 1s$, $\beta 2s$ and $\beta 3s$ in the same cell. The current I2s flow from the common drain $\alpha D$ to the three second nearest neighbors $\gamma 1s$, $\gamma 2s$ and $\gamma 3s$ in the adjacent cells.

In the variation shown in FIGS. 7A and 7B, the resistance of the interconnection metals is increased because the interdigitating fingers become narrower like the patterns shown in FIG. 6, as compared with the electrode patterns shown in FIG. 3. However, the second current I2s flowing to the second nearest sources is trebled, and the bulk resistance is reduced.

Figure 8:
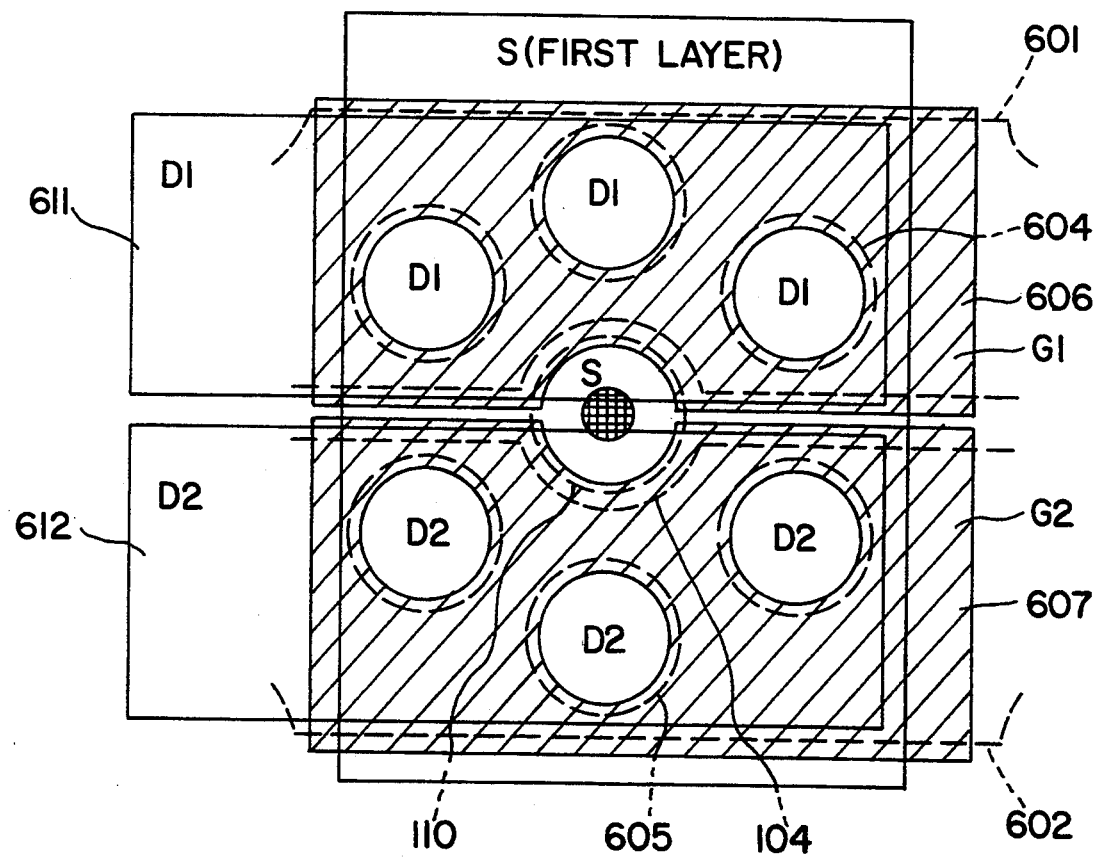
FIGS. 8, 9 and 10 are top views for showing various lateral configurations of the gate electrodes which can be used for the present invention.
Figure 9:
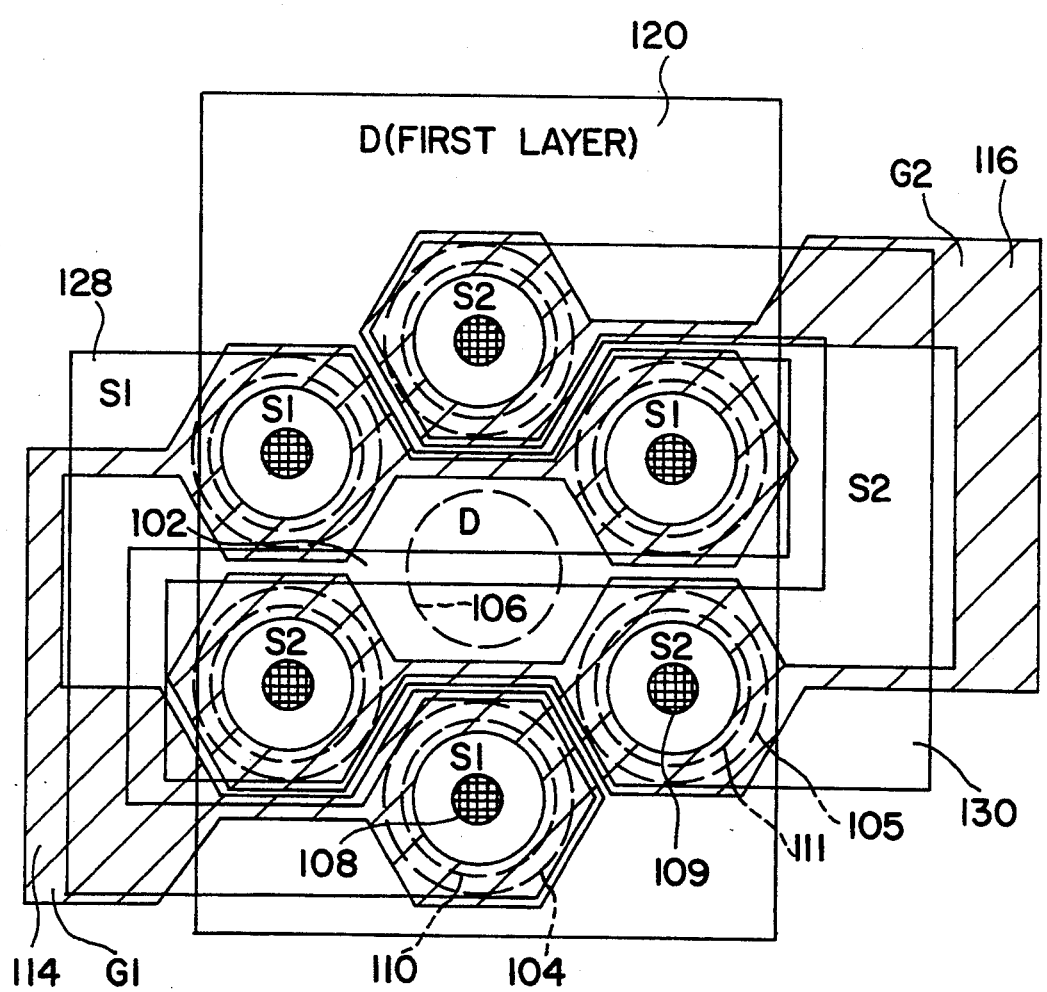
Figure 10:
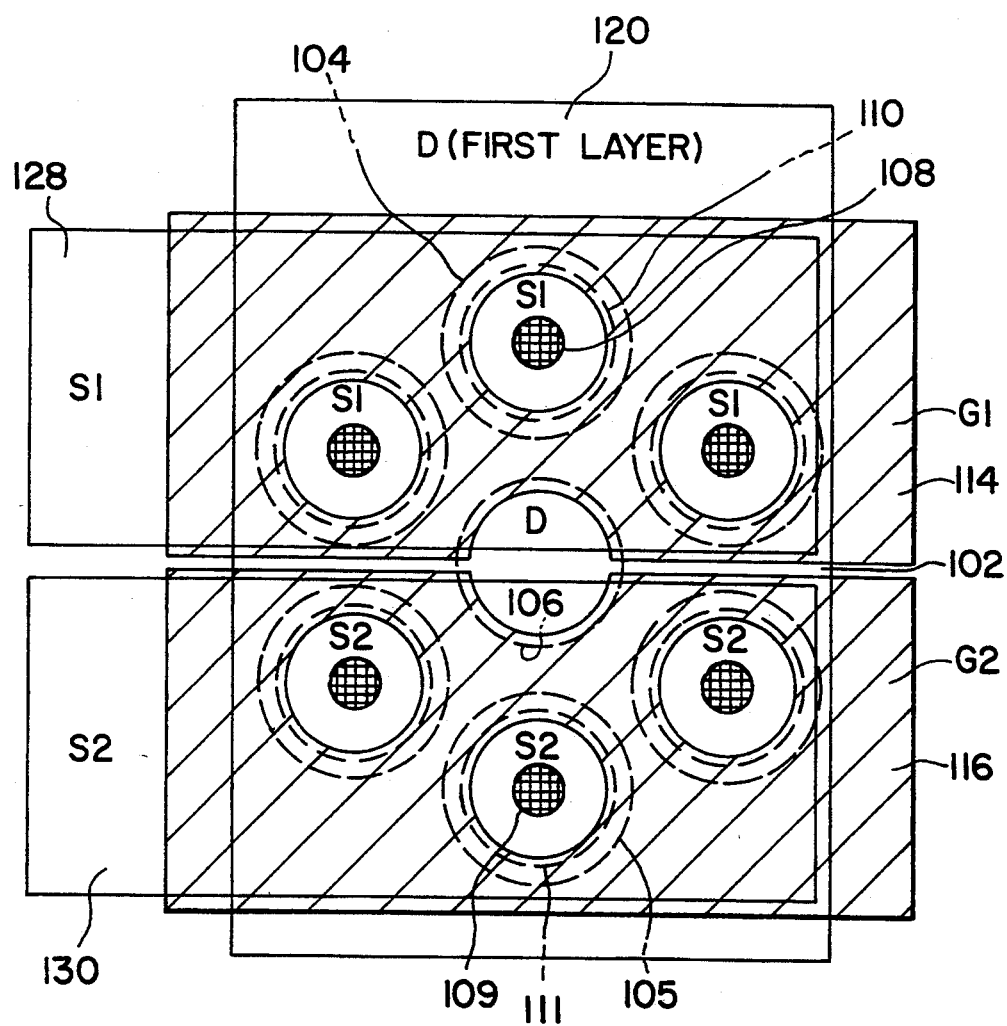

FIGS. 8, 9 and 10 shows lateral geometries for one unit cell. The lateral geometry shown in FIG. 8 can be used in the variation of the second embodiment in which the three first individual drains are located on the upper side of common source, and the three second individual drains are on the lower side. Each of the first and second gate electrode (G1 and G2) has at least one rectangular portion having a plurality of circular openings each of which is concentric with one of the drain contact regions. The lateral layout shown in FIG. 9 can be used in the variation of the first embodiment shown in FIGS. 7A sand 7B. Each of the first and second gate electrodes 114 and 116 (G1 and G2) has a plurality of ring-shaped portions each of which is formed directly above one of the well regions. In the example shown in FIG. 9, each ring-shaped portion has a circular inner boundary, and a hexagonal outer boundary. The configuration shown in the top view of FIG. 10 can be used in the first embodiment. Each of the first and second gate electrodes 114 and 116 extends over the upper or lower half of the hexagon of the unit cell, and has a plurality of circular openings each of which is concentric with a unique one of the well regions 104 or 105.

The preceding embodiments employ the two-level metallization structure in which the common electrode is formed in one of two conducting layers, and the two individual electrodes are formed in the other of the conducting layers. In the first embodiment, for example, the common drain electrode 120 is formed in the first (lower) conducting layer, and the first and second individual source electrodes (S1 and S2) 128 and 130 are formed in the second (upper) conducting layer. However, it is possible to form the common drain electrode in the upper conducting layer, and the first and second source electrodes in the lower conducting layer. In this case, there is no need for patterning the drain electrode. Therefore, it is possible to form an electrode pad on the active area in which devices are formed, and to reduce the chip size.

Figure 11:
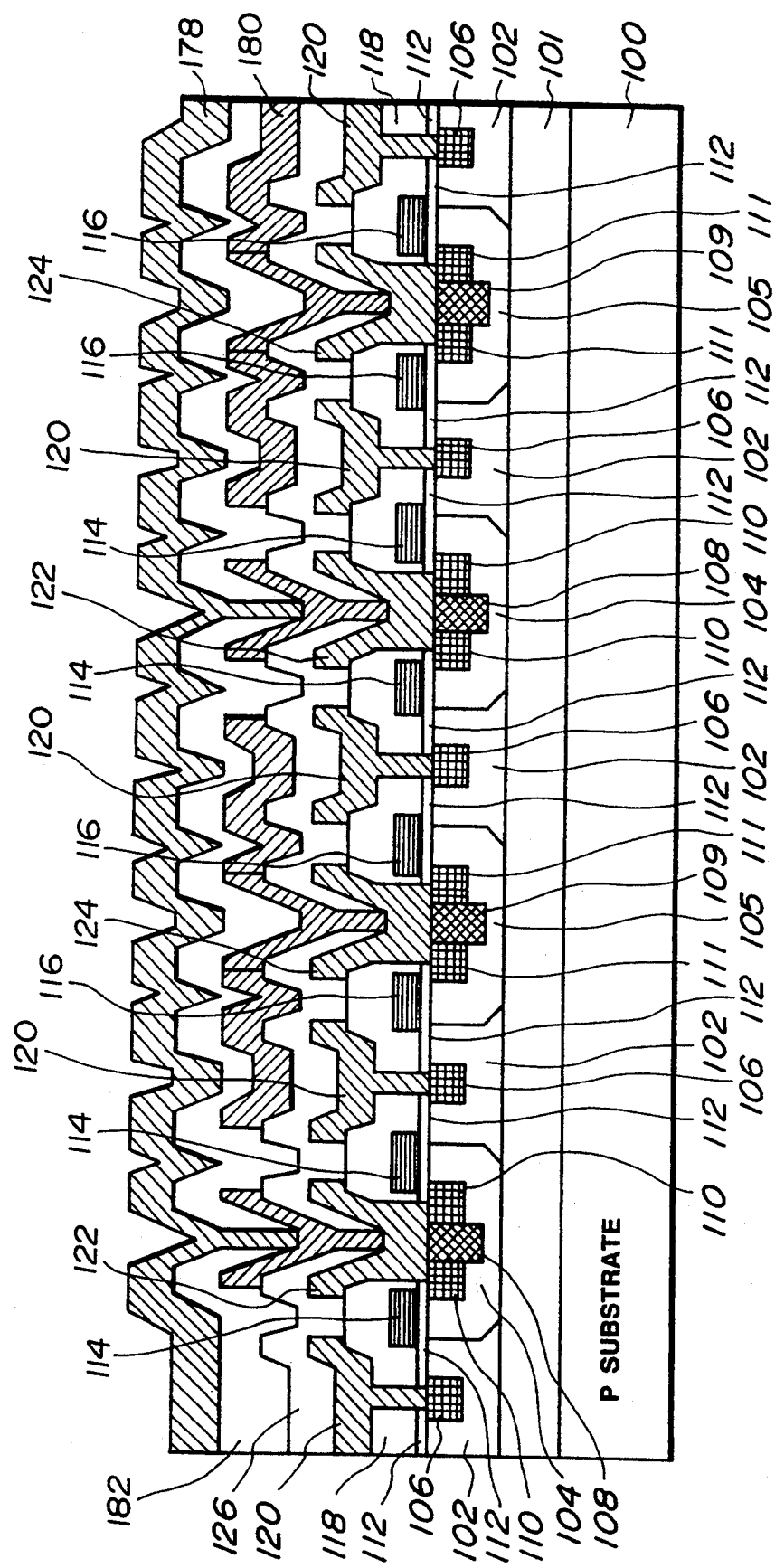
FIG. 11 is a cross sectional view for showing a three-level metallization structure which can be substituted for a two-level metallization structure shown in FIG. 1.

FIG. 11 shows a three-level metallization structure which can be employed for the first embodiment. In this structure, the common drain electrode 120 is formed in the first conducting layer like the structure of FIG. 1. However, first and second source electrodes 178 and 180 of the first and second MOS transistors Tr1 and Tr2 are formed at different levels. In the example shown in FIG. 11, the second source electrode 180 is formed on the second insulating layer 126 which is formed on the common drain electrode 120 of the lowest level. A third insulating layer 182 is formed on the second source electrode 180 of the middle level. The first source electrode 178 is formed on the third insulating layer 182. The three-level (or three-layer) structure somewhat complicates the fabrication process. However, it is possible to reduce the interconnection resistance by eliminating the need for forming striped source electrode patterns.

In the preceding embodiments, the unit cell is shaped like a regular polygon having six sides. However, the shape of the unit cell may be a regular polygon such as a triangle or a square.

In the preceding embodiment, the two different transistors are formed in each unit cell. However, it is possible to form three or more distinct transistors in each unit cell.

What is claimed is:

1. A transistor circuit comprising:

a plurality of common regions of a first conductivity type formed in a semiconductor substrate;

a group of individual regions of the first conductivity type which are formed in said semiconductor substrate around said common region, and which are separated from one another and from said common region in said semiconductor substrate;

said group consisting of a first subgroup and a second subgroup, and each of said individual regions belonging to only one of said first and second subgroups, each of said first and second subgroups containing at least two of said individual regions;

first and second separate regions formed in said semiconductor substrate, each of said individual regions being formed in one of said separate regions;

an intervening region which is formed in said semiconductor substrate and which separates said separate regions from one another, said common region being formed in said intervening region, said intervening region forming a pn junction with each of said separate regions;

a common electrode connected with each of said common regions;

first and second individual electrodes each of which is connected with at least one of said individual regions, each of said individual regions being connected with only one of said individual electrodes; and first and second insulated gate electrodes which are formed on said semiconductor substrate, said first gate electrode forming a first large MOS transistor with said common electrode and said first individual electrode, and said second gate electrode forming a second large MOS transistor with said common electrode and said second individual electrode, wherein each of said individual regions and each of said common regions extends into said semiconductor substrate from a first major surface of said semiconductor substrate, wherein each of said common regions is in direct contact with said common electrode, and each of said individual regions is in direct contact with one of said first and second individual electrodes, wherein each of said individual regions belonging to said first subgroup forms a first small MOS transistor with one of said common regions, and each of said individual regions belonging to said second subgroup forms a second small MOS transistor with said common regions, each of said first and second small MOS transistors comprising a first electrode which is one of a drain and source electrode pair, and a second electrode which is the other of said drain and source electrode pair, wherein said transistor circuit further comprises an interconnecting structure formed above said first major surface of said semiconductor substrate, said interconnecting structure comprising a first conductive portion by which said first electrodes of said first and second small MOS transistors formed by said individual regions of said group are all connected together and integrated into said common electrode, a second conductive portion by which said second electrodes of said first small MOS transistors are connected together and integrated into said first individual electrode of said first large MOS transistor so that said first large MOS transistor is constituted by said first small MOS transistors which are connected in parallel, a third conducting portion by which said second electrodes of said second small MOS transistors are connected together and integrated into said second individual electrode of said second large MOS transistor so that said second large MOS transistor is constituted by said second small transistors which are connected in parallel;

wherein said common regions and said individual regions are regularly arranged in said first major surface of said semiconductor substrate so as to form a regular periodic pattern in said first major surface; and wherein, in said first major surface, a pre-determined number of said individual regions are arranged in a circle at the center of which one of said common regions is located.

2. A transistor circuit according to claim 1 wherein each of said individual regions and said common region is circular in said first major surface of said semiconductor substrate.

3. A transistor circuit according to claim 2 wherein each of said common regions is surrounded by the predetermined number of said individual regions which are six in number, and which are arranged so as to form a regular hexagon in said first major surface of said semiconductor substrate.

4. A transistor circuit according to claim 3 wherein each of said common and individual regions is a highly doped region whose doping concentration is higher than that of any of said intervening, and first and second separate regions.

5. A transistor circuit according to claim 4 wherein said transistor circuit further comprises a bottom layer of a second conductivity type which extends into said semiconductor substrate from a second major surface of said semiconductor substrate toward said first major surface, and a buried layer which is formed on said bottom layer within said semiconductor substrate and which is identical in conductivity type with said intervening region, each of said first and second separate regions and said intervening region extending from said first major surface of said semiconductor substrate to said buried layer.

6. A transistor circuit according to claim 3 wherein, in each regular hexagon formed by six of said individual regions whose centers are located, respectively, at six vertexes of the regular hexagon around one of said common regions, three of said individual regions are connected with said first individual electrode, and the remaining three of said individual regions are connected with said second individual electrode.

7. A transistor circuit according to claim 6 wherein, in each regular hexagon, the three of said individual regions connected with said first individual electrode and the remaining three of said individual regions connected with said second individual electrode are arranged alternately.

8. A transistor circuit according to claim 6 wherein, in each regular hexagon, the three of said individual regions connected with said first individual electrode are arranged consecutively in one side of a bisecting line bisecting the regular hexagon in said first major surface and the remaining three of said individual regions connected with said second individual electrode are arranged consecutively in the other side of said bisecting line.

9. A transistor circuit according to claim 2 wherein, each of said common regions is located at one of centered points in said first major surface of said semiconductor substrate so that a center of each common region in said first major surface is coincident with one of said centered points, each of said individual regions being located at one of lattice points in said first major surface so that a center of each individual region in said first major surface is coincident with one of said lattice points, said lattice points being regularly distributed in said first major surface so as to form a regular periodic two-dimensional lattice formed by juxtaposition of unit cells each having a shape of a equilateral polygon with one of said centered points in the center.

10. A transistor circuit according to claim 9 wherein each of said first and second individual electrodes comprises a film portion having a plurality of fingers shaped like parallel stripes, said fingers of said first and second electrodes being arranged alternately.

11. A transistor circuit according to claim 10 wherein said common electrode comprises a film portion which is formed on a first insulating layer which is formed on said first and second gate electrodes, and said film portions of said first and second individual electrodes are both formed on a second insulating layer which is formed on said film portion of said common electrode.

12. A transistor circuit according to claim 9 wherein each of said common electrode and said first and second individual electrodes comprises a conducting film portion, one of said film portions being an intermediate film portion, and the other film portions being, respectively, upper and lower film portions, said lower film portion being formed on a first insulating layer formed on said first and second gate electrodes, said intermediate film portion being formed on a second insulating layer formed on said lower film portion, said upper film portion being formed on a third insulating layer formed on said intermediate film portion.

13. A transistor circuit according to claim 1 wherein said common electrode is a common drain electrode common to said first and second large MOS transistors, said first and second individual electrodes are, respectively, first and second individual source electrodes of said first and second large MOS transistors, said individual regions of said first subgroup are first individual source regions, said individual regions of said second subgroup are second individual source regions, each of said common regions is a common drain contact region common to said first and second large MOS transistors, said intervening region is an intervening drain region of the first conductivity type common to said first and second large MOS transistors, said first separate region comprises a plurality of first well regions of a second conductivity type opposite to the first conductivity type, and said second separate region comprises a plurality of second well regions of the second conductivity type, each of said first individual source regions being formed in one of said first well region, and each of said second individual source regions being formed in one of said second well region.

14. A transistor circuit according to claim 13 wherein said first and second well regions are formed equidistantly around said common drain contact region.

15. A transistor circuit according to claim 14 wherein said first and second well regions are regularly arranged so that said well regions form a regular periodic network consisting of a plurality of unit cells each comprising one of said common drain contact regions, and that a predetermined number of said well regions are arranged in a circle around each common drain contact region, said predetermined number being equal to one of three, four and six.

16. A transistor circuit according to claim 15 wherein, in each of said first and second well regions, a well contact region of the second conductivity type is formed, and surrounded by said individual source region which is annular.

17. A transistor circuit according to claim 15 wherein said first and second well regions are arranged alternately in a circle around each of said drain contact regions.

18. A transistor circuit according to claim 1 wherein said common electrode is a common source electrode common to said first and second large MOS transistors, said first and second individual electrodes are, respectively, first and second individual drain electrodes of said first and second large MOS transistors, said individual regions of said first subgroup are first individual drain contact regions connected with said first individual drain electrode, said individual regions of said second subgroup are second individual drain contact regions connected with said second individual drain electrode, each of said common regions is a common source region common to said first and second large MOS transistors, said intervening region comprises a common well region of a second conductivity type, said first separate region is a first drain region of the first conductivity type, and said second separate region is a second drain region of the first conductivity type, said first drain contact regions being formed in said first drain region, and said second drain contact regions being formed in said second drain region.

19. A transistor circuit according to claim 18 wherein said individual drain contact regions are regularly arranged so that said drain contact regions form a regular periodic network consisting of a plurality of unit cells each comprising one of said common source regions, and that a predetermined number of said drain contact regions are arranged in a circle around each common source region, said predetermined number being one of three, four and six.

20. A transistor circuit according to claim 19 wherein said first and second drain contact regions are arranged alternately in a circle around each of said source regions.

21. An integrated circuit comprising:
- a main drain region of a first conductivity type which is formed in a semiconductor substrate and which extends into said semiconductor substrate from a first major surface of said semiconductor substrate;
- a first drain contact region of the first conductivity type which is formed in said semiconductor substrate and which is connected with said main drain region;
- a drain electrode connected with said drain contact region;
- a plurality of well regions of a second conductivity type which are formed around said drain contact region in said semiconductor substrate, which are in contact with said main drain region, which are separate from one another, and which are equidistant from said drain contact region;
- a plurality of source regions of the first conductivity type which are separate from one another, each of said source regions being connected with one of said well regions;
- a plurality of source electrodes which are selectively connected with said source regions and which are separate from one another; and
- a plurality of gate electrodes which are insulated from said semiconductor substrate, and which are separate from one another, each of said gate electrodes being formed above at least one of said well regions between said main drain region and one of said source regions;
- wherein said integrated circuit comprises further drain contact regions of the first conductivity type each of which is connected with said main drain region, each of said drain contact regions being surrounded by a predetermined number of said well regions, said predetermined number being one of three, four and six.

22. An integrated circuit according to claim 21 wherein each of said drain contact regions and said well regions extends into said semiconductor substrate from said first major surface, and said drain contact region and said well regions are arranged orderly in said first major surface so that each of said drain contact region is surrounded by a nearest neighboring well group consisting of the predetermined number of said well regions which are arranged in a circle at regular intervals, and each of said well regions is also surrounded by a nearest neighboring drain group consisting of a predetermined number of said drain contact regions which are arranged in a circle at regular intervals.

23. An integrated circuit according to claim 21 wherein each of said source regions is formed in a unique one of said well regions, and said drain contact region is surrounded by a predetermined number of said source regions which are arranged in a circle around said drain contact region, and which are connected with said source electrodes in such an alternate manner that each of said source regions is electrically separated from two nearest neighbors of said source regions, said predetermined number being an even number equal to or greater than four.

24. An integrated circuit comprising:
- a main drain region of a first conductivity type which extends into a semiconductor substrate from a first major surface of said semiconductor substrate;
- a first-mentioned well region of a second conductivity type formed in said drain region;
- a source region of the first conductivity type connected with said well region;
- a source electrode connected with said source region;
- a plurality of drain contact regions of the first conductivity type which are separate from one another, which are connected with said main drain region, which are formed around said well region, and which are equidistant from said well region;
- a plurality of drain electrodes which are separate from one another and which are selectively connected with said drain contact regions; and
- a plurality of gate electrodes which are insulated from said semiconductor substrate and which are separate from one another, each of said gate electrode being formed above said well region between said main drain region and said source region.

25. An integrated circuit according to claim 24 wherein said integrated circuit further comprises second-mentioned well regions of the second conductivity type which are connected with said main drain region, and each of said well regions is surrounded by a predetermined number of said drain contact regions, said predetermined number being one of three, four and six.

26. An integrated circuit according to claim 25 wherein each of said well regions and said drain contact regions extends into said semiconductor substrate from said first major surface of said semiconductor substrate, and said well regions and said drain contact regions are arranged orderly in said first major surface so as to form a regular periodic network in which each of said well regions is surrounded by the predetermined number of said drain contact regions which are arranged in a circle at regular intervals, and each of said drain contact regions is surrounded by a predetermined number of said well regions which are arranged in a circle at regular intervals.

27. An integrated circuit according to claim 24 wherein said well region is surrounded by a predetermined number of said drain contact regions which are arranged in a circle and which are connected with said drain electrodes in such an alternate manner that each of said drain contact regions is electrically separated from two nearest neighbors of said drain contact regions, said predetermined number being an even number equal to or greater than four.

28. A transistor circuit comprising:
- a common region of a first conductivity type formed in a semiconductor substrate;
- a plurality of first contact regions disposed throughout said common region;
- a common drain electrode in contact with said first contact regions;
- a plurality of MOS transistor groups, each of said groups comprising a plurality of MOS transistors arranged symmetrically about and utilizing one of said first contact regions as a common drain, said MOS transistors each comprising a source region of the first conductivity type disposed within a well region of a second conductivity type;
- a plurality of second contact regions of the second conductivity type, each of which is disposed within a source region and in contact with one of said well regions and one of a first or second source electrodes;

and a plurality of gate electrodes, each of which is disposed above a well region in the area between the corresponding source region and said common region;

wherein said well region is circular in a surface of said semiconductor substrate, and each source region comprises an annular region which is annular in the surface of said semiconductor substrate and which is concentric with one of said well regions, and wherein a predetermined number of said well regions are arranged symmetrically about one of said first contact regions, said predetermined number being one of three, four and six.

29. A transistor circuit comprising:

a common region of a first conductivity type formed in a semiconductor substrate;

a plurality of first contact regions disposed throughout said common region;

a common source electrode in contact with said first contact regions;

a plurality of MOS transistor groups, each of said groups comprising a plurality of MOS transistors arranged symmetrically about and utilizing one of said first contact regions as a common source, said MOS transistors each comprising a drain region of the first conductivity type disposed within a well region of a second conductivity type;

a plurality of second contact regions of the second conductivity type, each of which is disposed within a drain region and in contact with one of said well regions and one of a first or second drain electrodes;

and a plurality of gate electrodes, each of which is disposed above a well region in the area between the corresponding drain region and said common region.

30. The transistor circuit of claim 29 wherein each of said well regions is a region of circular diffusion, and each drain region comprises a region of annular diffusion which is concentric with one of said well regions.

31. The transistor circuit of claim 28 wherein said common drain electrode comprises a conducting layer with insulating portions.

32. The transistor circuit of claim 28 wherein said common drain electrode comprises a conducting layer with insulating portions.

33. The transistor circuit of claim 29 wherein said common source electrode comprises a conducting layer with insulating portions.

34. The transistor circuit of claim 30 wherein said common drain electrode comprises a conducting layer with insulating portions.

35. The transistor circuit of claim 31 wherein said first and second source electrodes comprise a second conducting layer with insulating portions, said second conducting layer being adjacent to said first conducting layer.

36. The transistor circuit of claim 32 wherein said first and second source electrodes comprise a second conducting layer with insulating portions, said second conducting layer being adjacent to said first conducting layer.

37. The transistor circuit of claim 33 wherein said first and second drain electrodes comprise a second conducting layer with insulating portions, said second conducting layer being adjacent to said first conducting layer.

38. The transistor circuit of claim 34 wherein said first and second drain electrodes comprise a second conducting layer with insulating portions, said second conducting layer being adjacent to said first conducting layer.

39. The transistor circuit of claim 31 Wherein said first and second source electrodes comprise separate conducting layers with insulating portions, said separate conducting layers being adjacent to one another, and one of said separate conducting layers being adjacent to said first conductive layer.

40. The transistor circuit of claim 32 wherein said first and second source electrodes comprise separate conducting layers with insulating portions, said separate conducting layers being adjacent to one another, and one of said separate conducting layers being adjacent to said first conductive layer.

41. The transistor circuit of claim 33 wherein said first and second drain electrodes comprise separate conducting layers with insulating portions, said separate conducting layers being adjacent to one another, and one of said separate conducting layers being adjacent to said first conducting layer.

42. The transistor circuit of claim 34 wherein said first and second drain electrodes comprise separate conducting layers with insulating portions, said separate conducting layers being adjacent to one another, and one of said separate conducting layers being adjacent to said first conducting layer.

43. A transistor circuit, comprising:

a main drain region of a first conductivity type formed in a semiconductor substrate and extending into said semiconductor substrate from a first major surface of said semiconductor substrate;

a plurality of drain contact regions of the first conductivity type, each of said drain contact regions being formed in said main drain region, and extending into said semiconductor substrate from said first major surface;

a plurality of first and second well regions of a second conductivity type, each of said well regions being formed in said semiconductor substrate and extending into said semiconductor substrate from said first major surface;

a plurality of first and second source regions of the first conductivity type, each of said source regions extending into said semiconductor substrate from said first major surface, each of said first source regions being formed in, and concentric in said first major surface with a unique one of said first well regions, and each of said second source regions being formed in, and concentric in said first major surface with a unique one of said second well regions;

a drain electrode connected with said drain contact regions;

first and second source electrodes, said first source electrode being connected with said first source regions, and said second source electrode being connected with said second source regions, said first and second source electrodes being separate from each other; and first and second gate electrodes, said first and second gate electrodes being insulated from said semiconductor substrate and being separate from each other, said first gate electrode comprising a plurality of active portions, each of said active portions of said first gate electrode being formed above one of said first well regions between said main drain region and one of said first source regions, said second gate electrode comprising a plurality of active portions, each of said active portions of said second gate electrode being formed above one of said second well regions between said main drain region and one of said second source regions, wherein said main drain region, said first source regions and said first gate electrode form a first DMOS transistor, and said main drain region, said second source regions and said second gate electrode form a second DMOS transistor, and wherein said drain contact regions are arranged regularly in said first major surface so as to form a regular periodic network having a plurality of unit cells, said first and second well regions being regularly arranged in said first major surface so as to form a regular periodic network having a plurality of unit cells, and a predetermined number of said first well regions and said predetermined number of said second well regions being arranged alternately around each of said drain contact regions in said first major surface.

44. A transistor circuit according to claim 43 wherein, in said first major surface, each of said drain contact regions is surrounded by said predetermined number of said first well regions and said predetermined number of said second well regions, said first and second well regions being arranged alternately in a circle.

45. A transistor circuit according to claim 43 wherein said transistor circuit further comprises a bottom layer of the second conductivity type, said bottom layer extending into said semiconductor substrate from a second major surface of said semiconductor substrate towards said first major surface, and a buried layer of the first conductivity type formed on said bottom layer within said semiconductor substrate.

46. A transistor circuit according to claim 43 wherein each of said first and second source electrodes comprises a film portion having a plurality of stripe-shaped fingers, said fingers of said first and second source electrodes being arranged alternately.

47. A transistor circuit according to claim 46 wherein said drain electrodes comprises a film portion formed on a first insulating layer, said first insulating layer being formed on said first and second gate electrodes, and said film portions of said first and second source electrodes being formed on a second insulating layer, said second insulating layer being formed on said film portion of said drain electrode.

48. A transistor circuit according to claim 43 wherein each of said drain electrodes and said first and second source electrodes comprises a conducting film portion, one of said film portions being an intermediate film portion, and the other of said film portions being, respectively, upper and lower film portions, said lower film portion being formed on a first insulating layer formed on said first and second gate electrodes, said intermediate film portion being formed on a second insulating layer formed on said lower film portion, said upper film portion being formed on a third insulating layer formed on said intermediate film portion.

49. A transistor circuit, comprising:
a main drain region of a first conductivity type formed in a semiconductor substrate and extending into said semiconductor substrate from a first major surface of said semiconductor substrate;

a plurality of drain contact regions of the first conductivity type, each of said drain contact regions being formed in said main drain region, and extending into said semiconductor substrate from said first major surface;

a plurality of first and second well regions of a second conductivity type, each of said well regions being formed in said semiconductor substrate and extending into said semiconductor substrate from said first major surface;

a plurality of first and second source regions of the first conductivity type, each of said source regions extending into said semiconductor substrate from said first major surface, each of said first source regions being formed in, and concentric in said first major surface with a unique one of said first well regions, and each of said second source regions being formed in, and concentric in said first major surface with a unique one of said second well regions;

a drain electrode connected with said drain contact regions:
first and second source electrodes, said first source electrode being connected with said first source regions, and said second source electrode being connected with said second source regions, said first and second source electrodes being separate from each other; and first and second gate electrodes, said gate electrodes being insulated from said semiconductor substrate and being separate from each other, said first gate electrode comprising a plurality of active portions, each of said active portions of said first gate electrode being formed above one of said first well regions between said main drain region and one of said first source regions, said second gate electrode comprising a plurality of active portions, each of said active portions of said second gate electrode being formed above one of said second well regions between said main drain region and one of said second source regions, wherein said main drain region, said first source regions and said first gate electrode form a first DMOS transistor, and said main drain region, said second source regions and said second gate electrode form a second DMOS transistor, and wherein said drain contact regions are arranged regularly in said first major surface so as to form a regular periodic network having a plurality of unit cells, said first and second well regions being regularly arranged in said first major surface so as to form a regular periodic network having a plurality of unit cells, and each of said drain contact regions being surrounded in said first major surface by a predetermined number of said first well regions arranged consecutively on one side of a straight bisecting line bisecting one of the unit cells formed by said first and second well regions and by said predetermined number of said second well regions arranged consecutively on the other side of said bisecting line.

50. A transistor circuit according to claim 49 wherein each of said drain contact regions is surrounded in said first major surface by said predetermined number of said first well regions, said first well regions being arranged consecutively in one half of a circle and by said predetermined number of said second well regions being arranged consecutively in the other half of said circle.

51. A transistor circuit according to claim 49 wherein said transistor circuit further comprises a bottom layer of the second conductivity type, said bottom layer extending into said semiconductor substrate from a second major surface of said semiconductor substrate towards said first major surface, and a buried layer of the first conductivity type formed on said bottom layer within said semiconductor substrate.

52. A transistor circuit, according to claim 49 wherein each of said first and second source electrodes comprises a film portion having a plurality of stripe-shaped fingers, said fingers of said first and second electrodes being arranged alternately.

53. A transistor circuit according to claim 52 wherein said drain electrode comprises a film portion formed on a first insulating layer, said first insulating layer being formed on said first and second gate electrodes, and said film portions of said first and second source electrodes being formed on a second insulating layer, said second insulating layer being formed on said film portion of said drain electrode.

54. A transistor circuit according to claim 49 wherein each of said drain electrodes and said first and second source electrodes comprises a conducting film portion, one of said film portions being an intermediate film portion, and the other film portions being, respectively, upper and lower film portions, said lower film portion being formed on a first insulating layer formed on said first and second gate electrodes, said intermediate film portion being formed on a second insulating layer formed on said lower film portion, said upper film portion being formed on a third insulating layer formed on said intermediate film portion.

55. A transistor circuit, comprising:
first and second main drain regions of a first conductivity type formed in a semiconductor substrate and extending into said semiconductor substrate from a first major surface of said semiconductor substrate:
a plurality of well regions of a second conductivity type formed in said semiconductor substrate and extending into said semiconductor substrate from said first major surface;
a plurality of source regions of the first conductivity type, each of said source regions extending into said semiconductor substrate from said first major surface, and each of said source regions being formed in, and concentric in said first major surface with a unique one of said well regions;
a plurality of first and second drain contact regions of the first conductivity type, each of said drain contact regions extending into said semiconductor substrate from said first major surface, said first drain contact regions being formed in said first main drain region, said second drain contact regions being formed in said second main drain region;
a source electrode connected with said source regions;
first and second drain electrodes, said first drain electrode being connected with said first drain contact regions, and said second drain electrode being connected with said second drain contact regions, said first and second drain electrodes being separate from each other; and
first and second gate electrodes, said gate electrodes being insulated from said semiconductor substrate and being separate from each other, said first gate electrodes comprising a plurality of active portions, each of said active portions of said first gate electrodes being formed above one of said well regions between said first main drain region and one of said source regions, said second gate electrodes comprising a plurality of active portions, each of said active portions of said second gate electrodes being formed above one of said well regions between said second main drain region and one of said source regions,
wherein said first main drain region, said first drain contact regions, said source regions and said first gate electrode form a first DMOS transistor, and said second main drain region, said second drain contact regions, said source regions and said second gate electrode form a second DMOS transistor, and
wherein said well regions are regularly arranged in said first major surface so as to form a regular periodic network having unit cells, and said first and second drain contact regions being regularly arranged in said first major surface so as to form a regular periodic network having unit cells, and a predetermined number of said first drain contact regions and said predetermined number of said second drain contact regions being arranged alternately around each of said well regions.

56. A transistor circuit according to claim 55 wherein each of said well regions is surrounded by said predetermined number of said first drain contact regions and said predetermined number of said second drain contact regions, said first and second contact regions being arranged alternately in a circle.

57. A transistor circuit according to claim 55 wherein said transistor circuit further comprises a bottom layer of the second conductivity type, said bottom layer extending into said semiconductor substrate from a second major surface of said semiconductor substrate towards said first major surface, and a buried layer of the second conductivity type formed on said bottom layer within said semiconductor substrate.

58. A transistor circuit according to claim 55 wherein each of said first and second drain electrodes comprises a film portion having a plurality of stripe-shaped fingers, said fingers of said first and second electrodes being arranged alternately.

59. A transistor circuit according to claim 58 wherein said source electrode comprises a film portion formed on a first insulating layer, said first insulating layer being formed on said first and second gate electrodes, and said film portions of said first and second drain electrodes being formed on a second insulating layer, said second insulating layer being formed on said film portion of said source electrode.

60. A transistor circuit according to claim 55 wherein each of said source electrodes and said first and second drain electrodes comprises a conducting film portion, one of said film portions being an intermediate film portion, and the other film portions being, respectively, upper and lower film portions, said lower film portion being formed on a first insulating layer formed on said first and second gate electrodes, said intermediate film portion being formed on a second insulating layer formed on said lower film portion, said upper film portion being formed on a third insulating layer formed on said intermediate film portion.

61. A transistor circuit, comprising:

first and second main drain regions of a first conductivity type formed in a semiconductor substrate and extending into said semiconductor substrate from a first major surface of said semiconductor substrate;

a plurality of well regions of a second conductivity type formed in said semiconductor substrate, and extending into said semiconductor substrate from said first major surface;

a plurality of source regions of the first conductivity type, each of said source regions extending into said semiconductor substrate from said first major surface, and each of said source regions being formed in, and concentric in said first major surface with a unique one of said well regions;

a plurality of first and second drain contact regions of the first conductivity type, each of said drain contact regions extending into said semiconductor substrate from said first major surface, said first drain contact regions being formed in said first main drain region, said second drain contact regions being formed in said second main drain region;

a source electrode connected with said source regions;

first and second drain electrodes, said first drain electrode being connected with said first drain contact regions, and said second drain electrode being connected with said second drain contact regions, said first and second drain electrodes being separate from each other; and first and second gate electrodes, said gate electrodes being insulated from said semiconductor substrate and being separate from each other, said first gate electrode comprising a plurality of active portions, each of said active portions in said first gate electrode being formed above one of said well regions between said first main drain region and one of said source regions, said second gate electrode comprising a plurality of active portions, each of said active portions of said second gate electrode being formed above one of said well regions between said second main drain region and one of said source regions, wherein said first main drain region, said first drain contact regions, said source regions and said first gate electrode form a first DMOS transistor, and said second main drain region, said second drain contact regions, said source regions and said second gate electrodes form a second DMOS transistor, and wherein said well regions are regularly arranged in said first major surface so as to form a regular periodic network having unit cells, and said first and second drain contact regions being regularly arranged in said first major surface so as to form a regular periodic network having Knit cells, and each of said well regions being surrounded by a predetermined number of said first drain contact regions arranged consecutively on one side of a straight bisecting line bisecting one of the unit cells formed by said first and second drain contact regions and by said predetermined number of said second drain contact regions arranged consecutively on the other side of said bisecting line.

62. A transistor circuit according to claim 61 wherein each of said well regions is surrounded by said predetermined number of said first drain contact regions arranged consecutively in one half of a circle and by said predetermined number of said second drain contact regions arranged consecutively in the other half of said circle.

63. A transistor circuit according to claim 61 wherein said transistor circuit further comprises a bottom layer of the second conductivity type, said bottom layer extending into said semiconductor substrate from a second major surface of said semiconductor substrate towards said first major surface, and a buried layer of the second conductivity type formed on said bottom layer within said semiconductor substrate.

64. A transistor circuit according to claim 61 wherein each of said first and second drain electrodes comprises a film portion having a plurality of stripe-shaped fingers, said fingers of said first and second electrodes being arranged alternately.

65. A transistor circuit according to claim 64 wherein said source electrode comprises a film portion formed on a first insulating layer, said first insulating layer being formed on said first and second gate electrodes, and said film portions of said first and second drain electrodes being formed on a second insulating layer, said second insulating layer being formed on said film portion of said source electrode.

66. A transistor circuit according to claim 61 wherein each of said source electrodes and said first and second drain electrodes comprises a conducting film portion, one of said film portions being an intermediate film portion, and the other film portions being, respectively, upper and lower film portions, said lower film portion being formed on a first insulating layer formed on said first and second gate electrodes, said intermediate film portion being formed on a second insulating layer formed on said lower film portion, said upper film portion being formed on a third insulating layer formed on said intermediate film portion.

* * * * *